(12) United States Patent
Holzer et al.

(10) Patent No.: US 11,362,698 B2
(45) Date of Patent: Jun. 14, 2022

(54) LOW-INSERTION-LOSS TRIPLE THROW SWITCH

(71) Applicant: University of Utah Research Foundation, Salt Lake City, UT (US)

(72) Inventors: Kyle David Holzer, Bountiful, UT (US); Jeffrey S. Walling, Salt Lake City, UT (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 0 days.

(21) Appl. No.: 16/632,326

(22) PCT Filed: Jul. 18, 2018

(86) PCT No.: PCT/US2018/042969
§ 371 (c)(1),
(2) Date: Jan. 17, 2020

(87) PCT Pub. No.: WO2019/018696
PCT Pub. Date: Jan. 24, 2019

(65) Prior Publication Data
US 2020/0169286 A1    May 28, 2020

Related U.S. Application Data

(60) Provisional application No. 62/535,124, filed on Jul. 20, 2017.

(51) Int. Cl.
*H04B 1/44* (2006.01)
*H01P 5/22* (2006.01)
*H03F 3/21* (2006.01)

(52) U.S. Cl.
CPC ............. *H04B 1/44* (2013.01); *H01P 5/222* (2013.01); *H03F 3/211* (2013.01); *H03F 2203/21142* (2013.01)

(58) Field of Classification Search
CPC .......... H04B 1/44; H04B 1/40; H04B 1/0475; H04B 1/123; H04B 1/56; H04B 10/077;
(Continued)

(56) References Cited

U.S. PATENT DOCUMENTS 4,420,839 A     12/1983  Hogerheiden
5,107,223 A *   4/1992   Sakai ................. H01P 1/182
                                                  330/122

(Continued)

FOREIGN PATENT DOCUMENTS

GB    2474710       4/2011
GB    2474710 A *   4/2011   .............. H01P 5/222

OTHER PUBLICATIONS

Holzer et al., A Multi-Channel Outphasing Ring Combiner for Multi-mode Output and Channel Aggregation, Oct. 4-6, 2016, 46th European Microwave Conference (EuMC), London, 2016, pp. 516-519, URL: https://ieeexplore.ieee.org/document/7824393.*

(Continued)

*Primary Examiner* — Lana N Le
(74) *Attorney, Agent, or Firm* — Workman Nydegger

(57) ABSTRACT

An electronic switch for switching between signal outputs comprises a 6-way symmetric hybrid ring combiner. Each port within the 6-way symmetric hybrid ring combiner is positioned at λ/4 wavelength increments around a circumference of the 6-way symmetric hybrid ring combiner.

19 Claims, 4 Drawing Sheets

(58) Field of Classification Search
CPC .......... H04B 10/07955; H04B 10/27; H04B 10/275; H04B 1/0483; H04B 1/28; H04B 1/30; H03F 3/211; H03F 2203/21142; H03F 1/0288; H03F 2203/21106; H03F 3/60; H03F 1/303; H01P 5/222; H01P 1/161; H01P 1/18; H01P 1/213; H01P 1/397; H01P 1/38; H01P 5/12; H01P 1/184; H01P 5/04; H01P 5/16; H01P 11/00; H01P 11/005; H01P 11/007; H01P 1/202; H01P 3/06; H01P 5/183; H01P 1/185; H01P 1/182; H01P 5/19; H01P 5/22; H03H 7/1775; H03H 7/175; H03H 7/1766; H03H 7/48; H03H 7/52; H04L 25/08; H04L 5/1461; G02F 1/0128; G02F 1/011; G02F 1/0121; G02F 1/0136; G02F 1/0955

See application file for complete search history.

(56) References Cited

U.S. PATENT DOCUMENTS

| | | | |
|---|---|---|---|
| 5,789,996 A * | 8/1998 | Borodulin | H01P 5/12 |
| | | | 333/117 |
| 5,903,827 A * | 5/1999 | Kennan | H01P 5/222 |
| | | | 333/120 |
| 7,616,058 B1 | 11/2009 | Nezakati | |
| 9,219,445 B2 * | 12/2015 | Nobbe | H03D 1/18 |
| 2002/0132601 A1 * | 9/2002 | Cho | H01P 5/222 |
| | | | 455/313 |
| 2004/0212529 A1 * | 10/2004 | Fehrenbach | G01S 7/03 |
| | | | 342/124 |
| 2010/0019860 A1 * | 1/2010 | Kim | H01P 5/04 |
| | | | 333/101 |
| 2011/0241953 A1 | 10/2011 | Su | |
| 2013/0201066 A1 | 8/2013 | Parsche | |
| 2016/0141742 A1 * | 5/2016 | Xue | H01P 5/12 |
| | | | 333/125 |
| 2017/0317710 A1 * | 11/2017 | Liu | H04B 1/0057 |
| 2018/0190461 A1 * | 7/2018 | Elberbaum | H01H 50/643 |

OTHER PUBLICATIONS

R. D. Beyers and D. I. L. de Villiers, "A general isolation network for N-way power combiners/dividers," 2015 IEEE MTT-S International Microwave Symposium, 2015, pp. 1-4, doi: 10.1109/MWSYM.2015.7166865 (Year: 2015).*

International Search Report and Written Opinion issued in PCT/US2018/042969 dated Oct. 15, 2018.

* cited by examiner

LOW-INSERTION-LOSS TRIPLE THROW SWITCH

CROSS-REFERENCE TO RELATED APPLICATIONS

This application claims priority to PCT Application No. PCT/US2018/042969, filed Jul. 19, 2018 entitled "LOW-INSERTION-LOSS TRIPLE THROW SWITCH," which claims priority to and the benefit of U.S. Provisional Application Ser. No. 62/535,124 entitled "LOW-INSERTION-LOSS TRIPLE THROW SWITCH", filed on Jul. 20, 2017, the entire content of which are incorporated by reference herein in their entirety.

BACKGROUND

Electronic switches are used across a wide range of different industries and applications. Switches include products such as simple light switches to highly complex integrated switches with computer processors. In a simple application, a switch can be used to provide power to a circuit or to prevent power from flowing into the same circuit.

While a light switch may comprise a relatively simple design, many switches must be specially designed for challenging use cases. For example, different switches have different transitions times, different maximum powers, different lifetime cycles, and various other different attributes. In some applications a switch with a relatively slow transition time may be completely suitable. In contrast, in some applications, only switches that have extremely fast transition times would be used.

One example of a challenging application for switches is the use of switches within high-power, high-performance switch applications in the Ku band. This particular use of switches has conventionally required large electro-mechanical switches. Conventional electro-mechanical switches typically consist of large, non-integrated switch packaging and driver circuits that have switch lifetime limits of ~1 million cycles. Additionally, many conventional electro-mechanical switches offer slow switching transition times of greater than 10 ms. These conventional electro-mechanical switches also suffer from limited vibration and temperature ruggedness due to the mechanical components.

These limitations each present challenges in the art. Accordingly, there is a need for Ku band switches that are capable of faster transition times and/or that are more durable.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed embodiments include an electronic switch for switching between signal outputs. The electronic switch comprises a 6-way symmetric hybrid ring combiner. Each port within the 6-way symmetric hybrid ring combiner is positioned at $\lambda/4$ increments around a circumference of the 6-way symmetric hybrid ring combiner. A first amplifier is in communication with a first input port of the 6-way symmetric hybrid ring combiner. The first amplifier emits a first signal. A second amplifier is in communication with a second input port of the 6-way symmetric hybrid ring combiner. The second amplifier is emitting a second signal. A first output port is located immediately between the first input port and the second input port. When the first signal and the second signal comprise a 0° phase difference, the first output port emits an output signal.

Disclosed embodiments also comprise an electronic switch for switching between signal outputs. The electronic switch comprises a 6-way symmetric hybrid ring combiner. Each port within the 6-way symmetric hybrid ring combiner is positioned at $\lambda/4$ increments around a circumference of the 6-way symmetric hybrid ring combiner.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Disclosed embodiments provide solid-state switches that are capable of handling Ku band communications. Disclosed embodiments can also achieve larger isolation while reducing the necessary control voltage. At least one disclosed embodiment comprises a ring combiner that has significant power handling capability, owing to the ring being a passive power combining structure.

Additionally, at least one disclosed embodiment comprises a discrete switch for handling Ku band communications without the use of electro-mechanical switch components. Additionally, disclosed embodiments provide switches with higher transition speeds and greater durability than conventional switches. The combination of such features provides several unique benefits to the art. The benefits are particularly present in relation to switches that handle Ku frequencies, which typically range from 12 gigahertz to 18 gigahertz.

Figure 1:
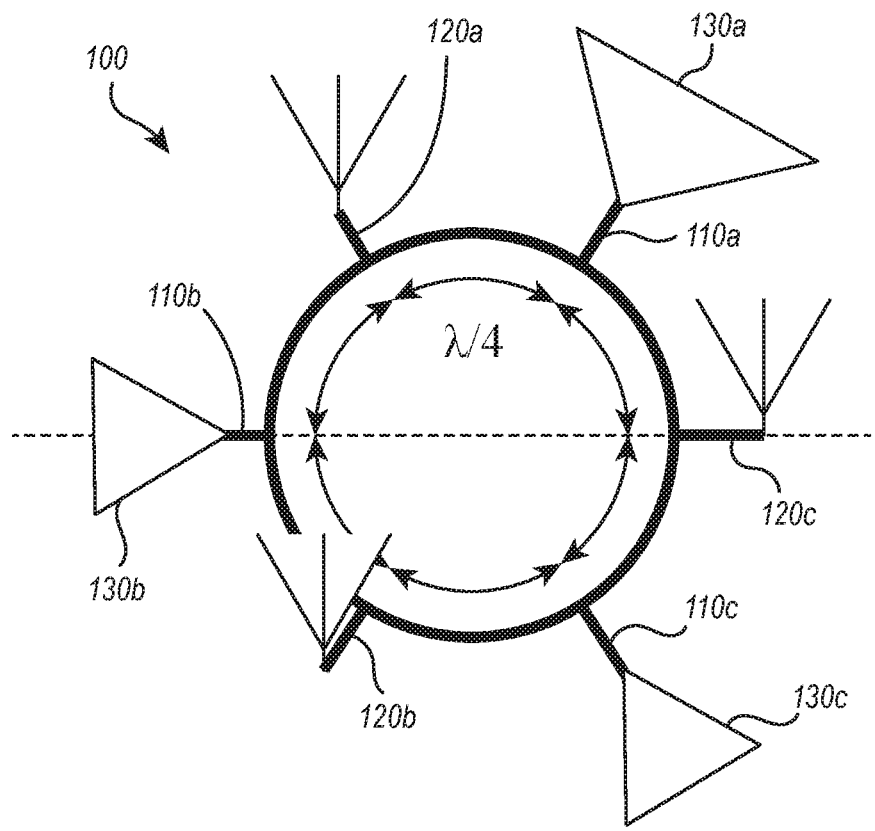
FIG. 1 depicts an embodiment of a ring combiner Single Pull Triple Throw (SP3T) switch.

Turning now to the figures, FIG. 1 depicts an embodiment of a ring combiner 100 configured as a Single Pull Triple Throw (SP3T) switch. The depicted ring combiner 100 is a versatile structure that allows power combining, mode switching, etc. In at least one embodiment, the ring combiner 100 operates as a switch for multiple input/multiple output networks.

For example, in at least one embodiment, a passive ring combiner structure is based on a 6-way symmetric hybrid ring combiner 100 that is configured as an SP3T switch. The SP3T comprises six different ports that are input or output ports. Additionally, in at least one embodiment, the proposed SP3T switch is comprised solely of passive microstrip lines that are driven by power amplifiers 130(a-c) at the input ports 110(a-c), and as such the power handling is limited only by the physical dimensions of the transmission lines (TL) used and the individual amplifiers 130(a-c) that drive the network. When compared to electro-mechanical switches, the lifetime switching cycles are only limited by the lifetime of the solid-state devices. Additionally, the disclosed rig combiner 100 switch comprises a solid-states physical structure which has greater durability than electro-mechanical components in a conventional switch.

Figure 2:
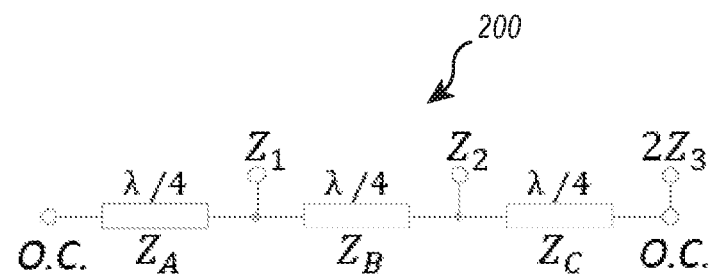
FIG. 2 illustrates schematics for even- and odd-mode analysis of the ring depicted in FIG. 1.
Figure 2:
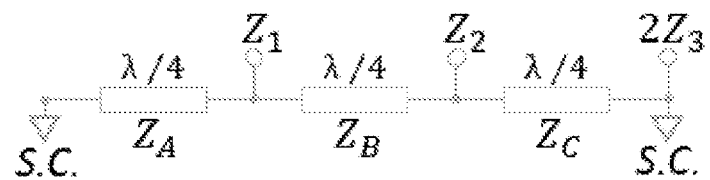

By way of an example analysis of the disclosed ring combiner 100, the line of symmetry for this embodiment of a ring combiner 100 is taken through the center of the ring, along the line of input port 110b to output port 120c, as shown by the dotted line in FIG. 1. For this analysis, input port 110c is a non-operational input port with high impedance. This appears as a virtual open circuit from the perspective of the ring and is neglected in the analysis. All three ring output ports 120(a-c) are present in the analysis although two of the ports experience high isolation at the designed operating frequency. FIG. 2 illustrates schematics for even- and odd-mode analysis 200 of the ring combiner 100 depicted in FIG. 1.

These circuits are reduced using transmission line theory to show the following ideal impedance values for the respective ring sections:

$$Z_C = \sqrt{2 Z_2 Z_3} \quad (1)$$

$$Z_B = \sqrt{Z_1 Z_2} \quad (2)$$

In at least one embodiment, when all ports 110(a-c), 120(a-c) are matched to 50Ω, the impedance values become $Z_C = 70.7\Omega$ and $Z_B = 50\Omega$. The same analysis and results can be shown for each active input pair around the ring. In at least one embodiment, to maximize impedance continuity between active ring input ports and the adjacent active ring output ports, all sections of the ring are set to the $Z_C$ impedance derived above.

Figure 3:
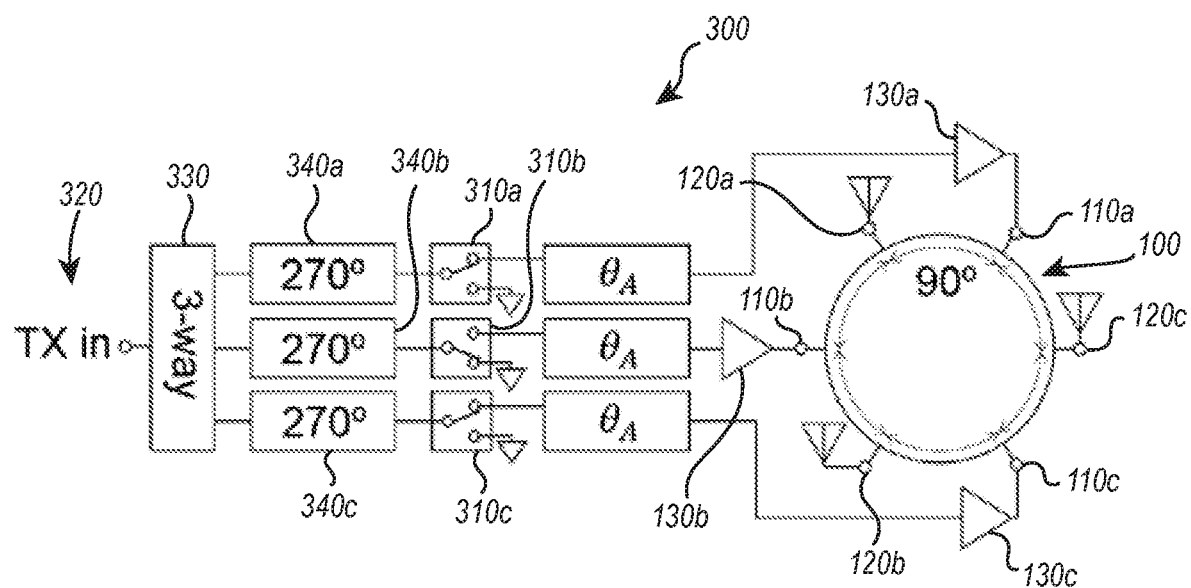
FIG. 3 depicts a schematic for an embodiment of a SP3T switch.

FIG. 3 depicts a schematic for an embodiment of a SP3T switch 300. In at least one embodiment, the SP3T switch 300 is built around a 3-channel aggregate ring combiner, using a symmetric 6-port ring combiner 100. In this embodiment, the amplifier inputs 130(a-c) are operated in pairs. All three amplifiers 130(a-c) are designed such that when any switch (e.g., 310b) is turned off, rendering the amplifier 130b non-operational, the impedance looking out of the corresponding ring input port 110b is a high impedance, approximating an open circuit. This minimizes loading on the combiner ring 100 from the off-state amplifier 130b.

As such, in at least one embodiment, the output port 120c directly between the two adjacent power amplifier driven inputs ports 110a, 110c becomes the active switch output. The remaining two ring output ports 120a, 120b are non-active and see high isolation, relative to the single output port 120c. Any of the three output ports 120(a-c) can be selected by driving the two adjacent input ports 110(a-c) with the same in-phase signal.

In at least one embodiment, the switching time is set by low-power, single-pole, single-throw (SPST) switches 310 (a-c), with a switching time comparable or faster in speed to conventional GaN on SiC PIN diode switches, with better port-to-port isolation. One will appreciate that the solid-state architecture of this SP3T switch 300 enables high vibration and temperature robustness.

In the depicted embodiment, the main input port 300 is split three ways with a T-junction splitter 330 with each of the output transmission lines 340(a-c) impedance sized at 100Ω, the correct impedance match for a 2-way splitter. Directly after the 3-way splitter 330 are 270° of electrical length transmission lines (TLs) 340(a-c) sized for the center of the transmission band. To accommodate impedance matching, the 270° may be split into three segments. The segment directly following the splitter junction is a 90° section of 100Ω. The next section is 90° of 70.7Ω, followed by a third 90° section of 50Ω.

After each of the 270° TLs 340(a-c) is a low-power, SPST switch 310(a-c). As shown two of these switches 310a, 310c are always in the thru transmission state and one of the switches 310b is in the off-state, with the input port 110b directly short circuited to ground. This short circuit rotates back along the transmission line to appear as an open circuit at the 3-way splitter junction 330, enabling the splitter 330 to operate as a well matched 2-way splitter for the two remaining ON paths.

In at least one embodiment, the SP3T switch 300 comprises equal electrical length $\theta_A$ paths routed to the amplifier devices 130(a-c). The length of these lines may be equal such that they can be used to accommodate routing between the switches 310(a-c) and the power amplifiers 130(a-c). The amplifier drain net may connect directly to the combiner ring 100, minimizing the electrical length of this connection and maintaining all three paths with equal electrical length. The three amplifiers 130(a-c) may be internally matched devices.

The drain bias network may be tuned to present an open circuit at the input port 110b when the amplifier 130b is left unbiased. In at least one embodiment, this requires a sufficiently sized choke in the power supply path, located close to the input port 110b to minimize inter-connect parasitics. Each of the three ring output ports 120(a-c) is uniquely selected with a combination of the amplifier biasing and the connection of the input SPST switch (e.g., on or off).

In the depicted embodiment, the output port 120c is selected when the two amplifiers 130a, 130c directly adjacent are biased ON, while the other amplifier 130b is biased OFF. The switch 310b directly preceding the OFF amplifier 130b is set to open with the other two switches 310a, 310c set to thru.

Figure 4:
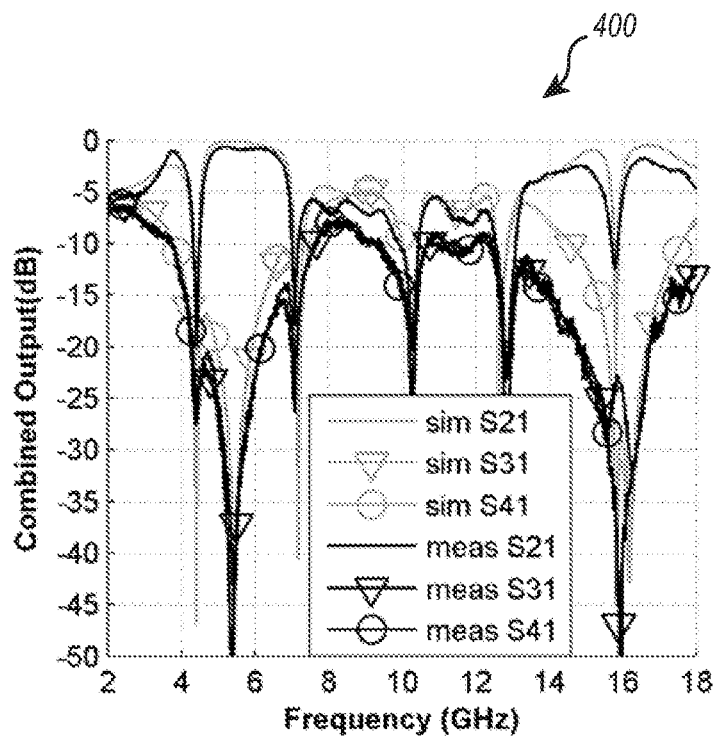
FIG. 4 illustrates both simulated and measured S-parameters for an embodiment of a SP3T switch.

FIG. 4 depicts both simulated and measured S-parameters for an embodiment of an SP3T switch 300. In the depicted graph 400, the fundamental switch design frequency is 5.5

GHz with the third harmonic at Ku band 16.5 GHz. The resonant ring topology of this embodiment provides similar thru channel insertion loss and adjacent channel isolation for both the fundamental and third harmonic frequencies. This embodiment also allows for SP3T switch operation in both bands. The periodic stop-bands in the measurement are resonant artifacts of the unused output from the un-isolated T-junction 3-way splitter. Measured insertion loss thru the depicted passive ring SP3T switch of the selected output port is 0.9 dB at 5.5 GHz and 1.8 dB at 16.5 GHz. Greater than 40 dB of adjacent port isolation is measured at the center-band frequencies for both the fundamental and third harmonic bands.

Figure 5:
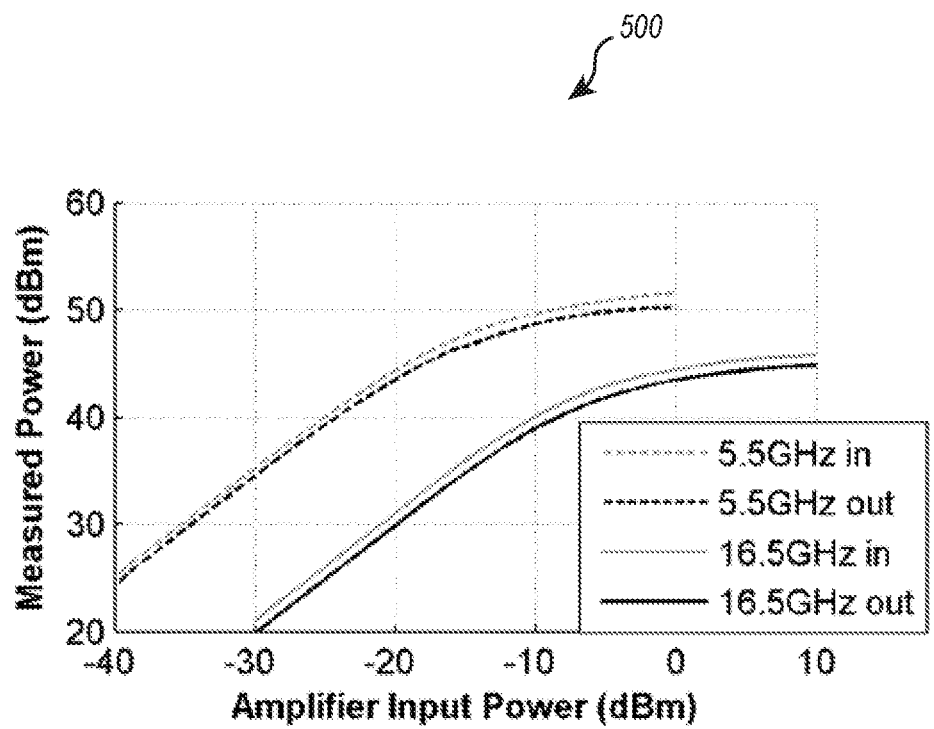
FIG. 5 depicts a chart showing high power handling and adjacent channel isolation of an embodiment of a 6-way ring based SP3T topology.

In at least one embodiment, as the switch output selection and adjacent output isolation functions are performed with passive distributed circuit elements, the SP3T switch is able to handle high output powers. To characterize the power handling capability for this SP3T topology, a high-power amplifier is used to drive the passive SP3T circuit. This approach isolates the essential performance for high power handling and adjacent channel isolation of the 6-way ring based SP3T topology, as shown in chart 500 in FIG. 5.

Data labeled 'in' is measured at the SP3T switch main input port (e.g., main input port 320 depicted in FIG. 3). Data labeled 'out' is measured at the selected output port. In the depicted embodiment, nearly identical performance was measured between all three output ports. For a 5.5 GHz input, the SP3T output was measured up to 106 Watts and for a 16.5 GHz input, and the output was measured up to 30 Watts of RF signal power (limited by the driving amplifier). At max output power there is 0.35 dB of compression at 5.5 GHz and no observable compression at 16.5 GHz.

In at least one embodiment, the measured power handling is limited by the available high-power RF amplifier and not the SP3T switch 300. Similarly, in at least one embodiment, the peak output power handling limit for the SP3T switch 300 is set by the dimensions and materials used to construct the TLs 340(*a-c*) and the ring combiner 100. High quality conductors, low loss-tangent dielectric materials and larger physical dimensions (e.g., line width) all contribute to higher power handling limits.

As expected by symmetry, all three output ports show similar performance when they are selected. When configured with active components the actual power loss in the SP3T switch 300 can be reduced compared to this measured data, due to the short line losses incurred between the amplifier ring input and the selected output power using the 0Ω resistors. These losses can be as low as a few tenths of a dB depending on transmission line construction and operating frequency.

Figure 6:
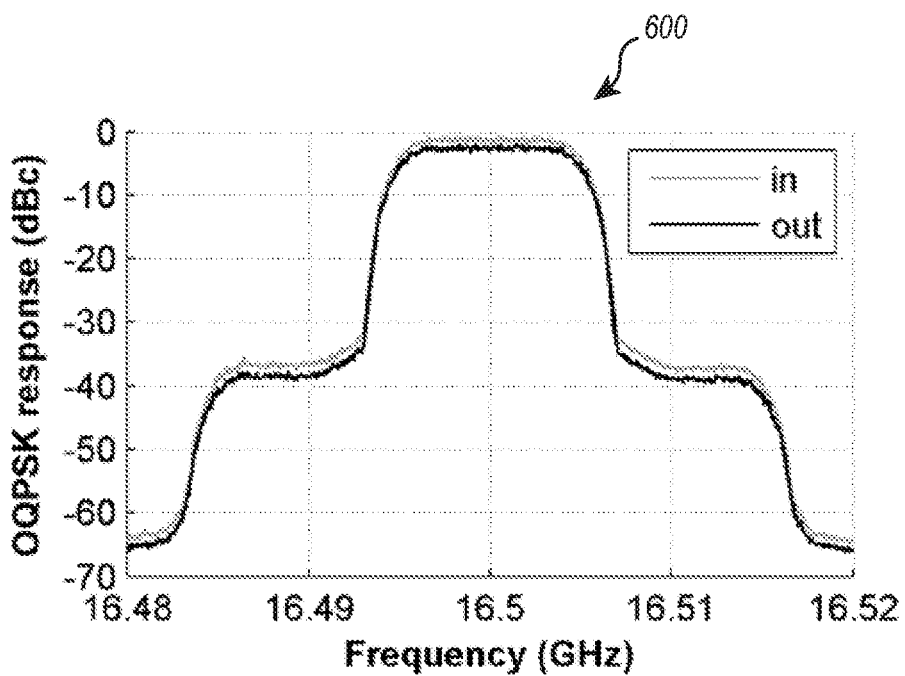
FIG. 6 illustrates a chart showing high linearity performance within an embodiment of a SP3T circuit.

In the depicted embodiment, to verify the effect of the switch on linearity, a 16.5 GHz, 10 Msps OQPSK signal is input to the SP3T switch 300 and measured at the selected output 120(*a-c*). High linearity performance is verified with the SP3T switch 300 with results as shown in chart 600 in FIG. 6. The measured power spectral density of the waveform shows an adjacent channel leakage (ACLR) ratio of >35 dBc. The signal at the input (in) and output (out) of the switch is shown, noting negligible distortion of the signal at the output, only the insertion loss of the switch.

Figure 7:
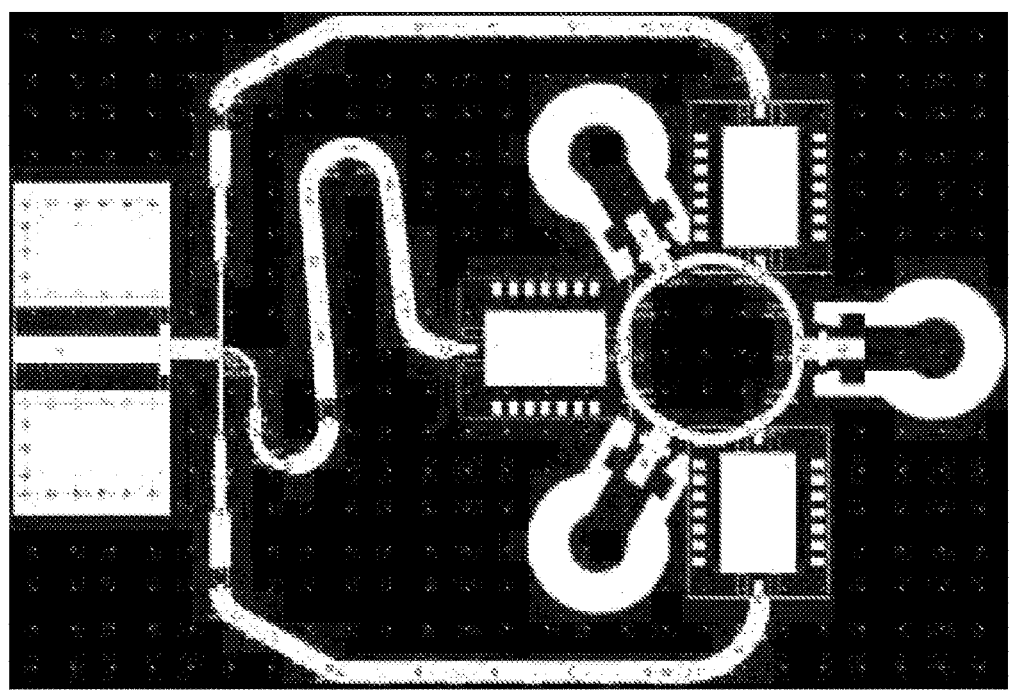
FIG. 7 illustrates an embodiment of an SP3T switch.

As described herein, the SP3T switch 300 depicted in FIG. 3 is realized in the embodiment of an SP3T switch 300 shown in FIG. 7. In the depicted embodiment, the design frequency is 15 GHz at the center of Ku-band in contrast to the design in the previous section that achieved Ku-band performance at the third harmonic of the fundamental frequency. Due to the high operating frequency, the ring diameter in this design is ~⅓ the size of the previous design; hence, the output connectors can no longer be placed inside the ring. This leads to the design utilizing a similar overall layout area to the prior design.

To evaluate the performance for this embodiment of a SP3T switch 300, a simulation is constructed, using a combination of measurement data for the active elements and a simulation for the distributed element components. Small signal S-parameters measurement data was de-embedded with calibration standards up to the PCB interface plane. The MaCom MA4SW110 SPST switch is chosen due to its nearly ideal short circuit behavior, achieving −0.12 dB return loss at the input port in the open state, and offering >40 dB of input-to-output isolation. This SPST is a dual PIN diode integrated on the same die, comprised of a series diode to present an open circuit for high isolation in the off-state, along with a shunt diode to ground at the input to further enhance isolation. This shunt input diode creates a short circuit, causing high input reflection for the intended application. In the closed state this switch offers ~0.6 dB of insertion loss. The Qorvo TGA2218-SM 12 W high power amplifier is chosen for efficient output power per unit area and −0.39 dB return loss at the output when the amplifier is in the off state (e.g., amplifier bias is off).

Figure 8:
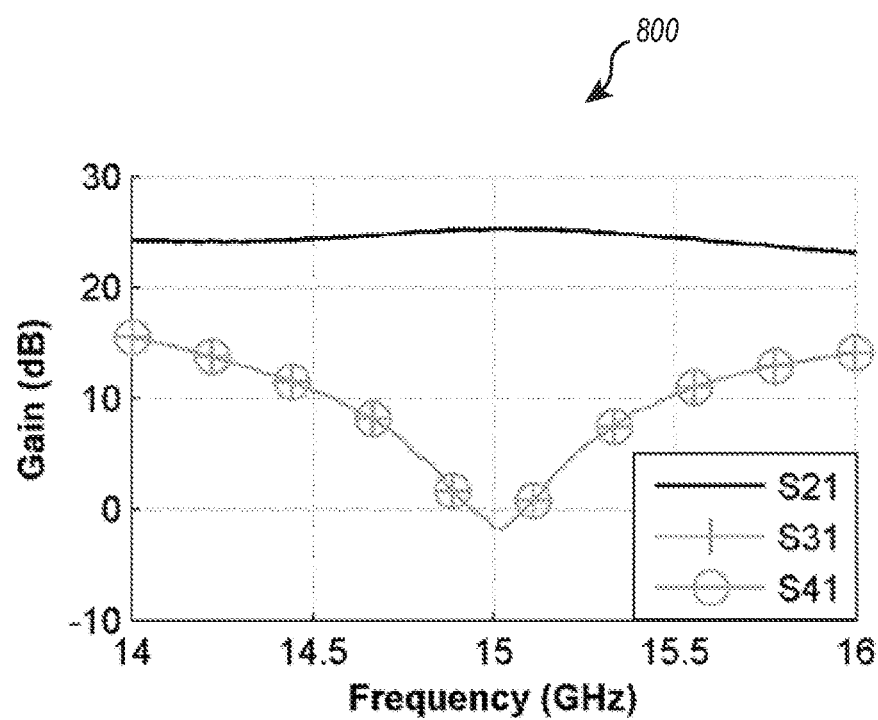
FIG. 8 illustrates simulated insertion gain and isolation of an embodiment of a SP3T switch.

De-embedded measurement data includes both the open- and closed-states of the SPST switch as well as biased ON and OFF data of the amplifier. The simulated insertion gain and isolation of the SP3T switch is shown in the chart 800 in FIG. 8. This design shows better than 25 dB of thru path gain and more than 25 dBc of adjacent output port isolation over a 158 MHz bandwidth. Reduced output port isolation is due primarily to the difficulty of presenting a true open circuit at the unused ring input port using a printed circuit board design, where the distance between the amplifier device and the ring are electrically significant. The distance between the amplifier device output node and the ring combiner in the presented design cause undesirable ring loading, slightly degrading output gain and adjacent output isolation performance. A performance improvement can be realized by integrating the amplifier device and distributed ring on the same integrated circuit or MMIC, or using a system in a package approach. The increased integration will enable the amplifier drain to be located directly on top of the ring input port.

Accordingly, disclosed embodiments comprise a new architecture for an SP3T switch 300, using a 6-way ring combiner 100 is presented. This approach can be adapted to higher frequency on an integrated circuit enabling higher adjacent output isolation due to reduced stub loading of the combiner ring 100 with the unused input port. Greater than 100 W of RF power handling is demonstrated with measurement results, while achieving greater than 30 dB of adjacent output port isolation. No linearity degradation is observable with a 10 Msps OQPSK waveform. A Ku band 20 W amplifier SP3T switch embodiment is presented with greater than 25 dBc of adjacent output port isolation over more than 158 MHz. The bandwidth of the ring based SP3T switch can be increased by adopting broadband ring combiner matching techniques. Higher power amplifiers could be used to increase the SP3T power handling up to the limit of the power handling due to the physical dimensions of the ring combiner.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An electronic switch for switching between signal outputs, the electronic switch comprising:
   a 6-way symmetric hybrid ring combiner, wherein each port within the 6-way symmetric hybrid ring combiner is positioned at λ/4 increments around a circumference of the 6-way symmetric hybrid ring combiner;
   a first single pull single throw switch attached to a first input port;
   a second single pull single throw switch attached to a second input port; and
   a third single pull single throw switch attached to a third input port.

2. The electronic switch as recited in claim 1, further comprising:
   a first amplifier in communication with a first input port of the 6-way symmetric hybrid ring combiner, the first amplifier emitting a first signal.

3. The electronic switch as recited in claim 2, further comprising:
   a second amplifier in communication with a second input port of the 6-way symmetric hybrid ring combiner, the second amplifier emitting a second signal.

4. The electronic switch as recited in claim 3, further comprising:
   a first output port located immediately between the first input port and the second input port.

5. The electronic switch as recited in claim 4, further comprising:
   when the first signal and the second signal comprise a 0° phase difference, the first output port emitting an output signal.

6. The electronic switch as recited in claim 5, further comprising:
   only when the first signal and the second signal comprise a 0° phase difference, the first output port emitting an output signal.

7. The electronic switch as recited in claim 1, further comprising:
   a first output port located immediately between a first input port and a second input port.

8. The electronic switch as recited in claim 7, further comprising:
   when a first signal received at the first input port and a second signal received at the second input port comprise a 0° phase difference, the first output port emitting an output signal.

9. The electronic switch as recited in claim 1, wherein:
   when the first single pull single throw switch is closed and the second single pull single throw switch is closed, a first output port that is positioned between the first input port and the second input port emits an output signal.

10. An electronic switch for switching between signal outputs, the electronic switch comprising:
    a symmetric hybrid ring combiner, wherein each port within the symmetric hybrid ring combiner is positioned at λ/4 increments around a circumference of the symmetric hybrid ring combiner,
    wherein when a first signal received at a first input port and a second signal received at a second input port comprise a 0° phase difference, a first output port, that is positioned between the first input port and the second input port, emits an output signal.

11. The electronic switch as recited in claim 10, wherein the symmetric hybrid ring combiner comprises a 6-way symmetric hybrid ring combiner.

12. The electronic switch as recited in claim 10, further comprising:
    a first amplifier in communication with a first input port of the symmetric hybrid ring combiner, the first amplifier emitting a first signal;
    a second amplifier in communication with a second input port of the symmetric hybrid ring combiner, the second amplifier emitting a second signal;
    the first output port located immediately between the first input port and the second input port; and
    only when the first signal and the second signal comprise a 0° phase difference, the first output port emitting an output signal.

13. The electronic switch as recited in claim 10, further comprising:
    only when the first signal and the second signal comprise a 0° phase difference, the first output port emitting an output signal.

14. The electronic switch as recited in claim 10, further comprising:
    a first single pull single throw switch in communication with a first input port;
    a second single pull single throw switch in communication with a second input port; and
    a third single pull single throw switch attached to a third input port.

15. The electronic switch as recited in claim 14, wherein:
    when the first single pull single throw switch is closed and the second single pull single throw switch is closed, a first output port that is positioned between the first input port and the second input port emits an output signal.

16. The electronic switch as recited in claim 15, wherein:
    when the second single pull single throw switch is closed and the third single pull single throw switch is closed, a second output port that is positioned between the second input port and the third input port emits an output signal.

17. The electronic switch as recited in claim 16, wherein:
    when the third single pull single throw switch is closed and the first single pull single throw switch is closed, a third output port that is positioned between the third input port and the first input port emits an output signal.

18. The electronic switch as recited in claim 16, wherein the first single pull single throw switch, the second single pull single throw switch, and the third single pull single throw switch output signals that comprise a 0° phase difference.

19. An electronic switch for switching between signal outputs, the electronic switch comprising:
    a 6-way symmetric hybrid ring combiner, wherein each port within the 6-way symmetric hybrid ring combiner is positioned at λ/4 increments around a circumference of the 6-way symmetric hybrid ring combiner;
    a first amplifier in communication with a first input port of the 6-way symmetric hybrid ring combiner, the first amplifier emitting a first signal;
    a second amplifier in communication with a second input port of the 6-way symmetric hybrid ring combiner; the second amplifier emitting a second signal;

a first output port located immediately between the first input port and the second input port; and when the first signal and the second signal comprise a 0° phase difference, the first output port emitting an output signal.

* * * * *